United States Patent
Kim et al.

(10) Patent No.: US 9,009,381 B2
(45) Date of Patent: Apr. 14, 2015

(54) USB CONNECTOR FOR WIRELESS COMMUNICATION DEVICE

(75) Inventors: Jung-Min Kim, Seongnam-si (KR);
Joong-Ho Jeong, Seoul (KR);
Kyung-Ho Kim, Seongnam-si (KR);
Yong-Sup Kim, Yongin-si (KR);
Dong-Soon Lim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 810 days.

(21) Appl. No.: 13/191,060

(22) Filed: Jul. 26, 2011

(65) Prior Publication Data

US 2012/0030400 A1 Feb. 2, 2012

(30) Foreign Application Priority Data

Jul. 29, 2010 (KR) ........................ 10-2010-0073211

(51) Int. Cl.
*G06F 13/20* (2006.01)
*H03H 7/00* (2006.01)
*H03H 1/00* (2006.01)

(52) U.S. Cl.
CPC ............. *G06F 13/20* (2013.01); *H03H 1/0007* (2013.01)

(58) Field of Classification Search
CPC ....... H03H 1/0007; H03H 7/427; H02B 3/30; G06F 13/20; G06F 13/4068

USPC ...................... 710/313; 333/12, 181
See application file for complete search history.

(56) References Cited

U.S. PATENT DOCUMENTS

| 4,888,675 A | * | 12/1989 | Kumar et al. ............... 363/47 |
| 5,838,216 A | * | 11/1998 | White et al. ................ 333/182 |
| 6,937,454 B2 | * | 8/2005 | Mikolajczak et al. ....... 361/111 |
| 2005/0102541 A1 | * | 5/2005 | Choi ............................ 713/300 |
| 2009/0278625 A1 | * | 11/2009 | Chen et al. ................... 333/181 |
| 2010/0020465 A1 | * | 1/2010 | Fukudome .................. 361/301.4 |
| 2011/0167180 A1 | * | 7/2011 | Towell et al. ................ 710/62 |

FOREIGN PATENT DOCUMENTS

KR 10-2005-0004420 A 1/2005

* cited by examiner

*Primary Examiner* — Benny Lee
*Assistant Examiner* — Rakesh Patel
(74) *Attorney, Agent, or Firm* — Jefferson IP Law, LLP

(57) ABSTRACT

A Universal Serial Bus (USB) apparatus for USB communication is provided. The USB apparatus includes a Printed Circuit Board (PCB) including a circuit for communicating data with an external device according to a USB communication standard, a connector for connecting to a USB terminal of the external device, and a noise reduction circuit connected between an output terminal of the PCB and the connector for reducing noise of a data signal. The noise reduction circuit includes a common-mode filter for removing harmonic components generated between a '+' data signal and a '−' data signal and passing the '+' data signal and the '−' data signal, which operate in a differential mode.

5 Claims, 6 Drawing Sheets

USB CONNECTOR FOR WIRELESS COMMUNICATION DEVICE

PRIORITY

This application claims the benefit under 35 U.S.C. §119 (a) of a Korean patent application filed in the Korean Intellectual Property Office on Jul. 29, 2010, and assigned Serial No. 10-2010-0073211, the entire disclosure of which is hereby incorporated by reference.

BACKGROUND OF THE INVENTION

1. Field of the Invention

The present invention relates to a Universal Serial Bus (USB) connector for a wireless communication device. More particularly, the present invention relates to a USB connector for improving reception sensitivity of a wireless communication device by blocking noise during USB communication between a wireless communication device and an electronic device.

2. Description of the Related Art

Most communication devices employ a Universal Serial Bus (USB) terminal to transmit and receive high-speed data to/from a computer. A USB is designed to replace a variety of existing serial and parallel connections and is used to connect various devices, such as a keyboard, a mouse, a scanner, a digital camera, a printer, a memory, and the like.

In USB communication, a host collectively manages all devices through a single line (or cable), and data exchange is available only between the host and the devices, and unavailable between the devices. It is not possible for multiple devices to simultaneously receive data because they can transmit and receive only one data signal through the single serial line at a time. To overcome these and other obstacles, a USB terminal transmits data on a packet basis. The host sends a Start Of Frame (SOF) signal, as a packet transmission command, every 1 millisecond (ms). In other words, recognizing 1 ms as one frame, the host generates commands to exchange packets with the devices.

Because USB communication employs a high-speed clock, harmonic frequencies of the clock may serve as interference to wireless communication frequencies, causing degradation of reception sensitivity. In addition, noise inside the computer may be coupled to USB signal lines and power lines, deteriorating reception sensitivity of USB communication.

In the related art, to block the noise during USB communication, an Inductor Capacitor (LC) low-pass filter for removing noise components generated in data lines is added to a Printed Circuit Board (PCB) of a wireless communication device with a USB connector, or mechanical shielding is applied to improve reception sensitivity.

FIG. 1 illustrates a USB communication device with an LC low-pass filter according to the related art.

Referring to FIG. 1, if a filter is added to a PCB of a wireless communication device, or mechanical shielding is applied thereto, noise may be radiated from the cable. Thus, a wireless communication device, in which a USB connector like a USB dongle rotates, may not effectively remove the noise generated from the computer, and the noise of USB communication.

Therefore, a need exists for a USB connector capable of effectively reducing noise of a wireless communication device employing USB communication.

SUMMARY OF THE INVENTION

Aspects of the present invention are to provide at least the above-mentioned problems and/or disadvantages and to provide at least the advantages described below. Accordingly, an aspect of the present invention is to provide a Universal Serial Bus (USB) connector capable of effectively reducing noise of a wireless communication device employing USB communication.

Another aspect of the present invention is to provide a USB connector including a circuit for removing noise in USB communication.

Another aspect of the present invention is to provide a device capable of effectively reducing noise in a rotary-type USB connector used for a wireless communication device.

In accordance with one aspect of the present invention, a USB apparatus for USB communication is provided. The USB apparatus includes a Printed Circuit Board (PCB) including a circuit for communicating data with an external device according to a USB communication standard, a connector for connecting to a USB terminal of the external device, and a noise reduction circuit connected between an output terminal of the PCB and the connector for reducing noise of a data signal. The noise reduction circuit may include a common-mode filter for removing harmonic components generated between a '+' data signal and a '−' data signal and passing the '+' data signal and the '−' data signal, which operate in a differential mode.

The noise reduction circuit may further include a first bypass capacitor connected between a ground line and a '+' data line outputting the '+' data signal, and a second bypass capacitor connected between the ground line and a '−' data line outputting the '−' data signal, to block high-frequency noise included in the '+' and '−' data signals.

The noise reduction circuit may further include a decoupling capacitor connected between a power line supplying power and a ground line to block high-frequency noise, which is coupled to the power line and the ground line.

The connector may be rotatably connected to the noise reduction circuit.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

Figure 1:
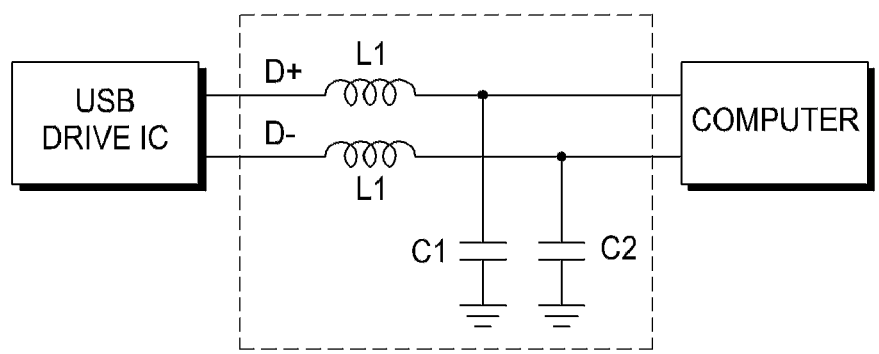
FIG. 1 illustrates a Universal Serial Bus (USB) communication device with an Inductor Capacitor (LC) low-pass filter according to the related art.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Exemplary embodiments of the present invention add a noise reduction circuit inside a Universal Serial Bus (USB) connector in order to reduce noise generated in a USB terminal.

A Printed Circuit Board (PCB) used for a common USB connector includes circuits for interfacing information with a communication means according to the USB communication standard, and an output terminal of the PCB includes USB D+/D− differential lines (or signal lines), a power line, and a ground line. The PCB for a USB connector is supported by an external mechanism, and is inserted into and fixed to an electronic device with a USB terminal. Therefore, exemplary embodiments of the present invention add a noise reduction circuit to a portion where a PCB for a USB connector is connected to external devices.

FIGS. 2 through 6, described below, and the various exemplary embodiments of the present invention provided are by way of illustration only and should not be construed in any way that would limit the scope of the present invention. Those skilled in the art will understand that the principles of the present disclosure may be implemented in any suitably arranged communications system. The terms used to describe various exemplary embodiments of the present invention provided to merely aid the understanding of the description, and that their use and definitions in no way limit the scope of the invention. Terms first, second, and the like are used to differentiate between objects having the same terminology and are in no way intended to represent a chronological order, unless where explicitly state otherwise. A set is defined as a non-empty set including at least one element.

Figure 2:
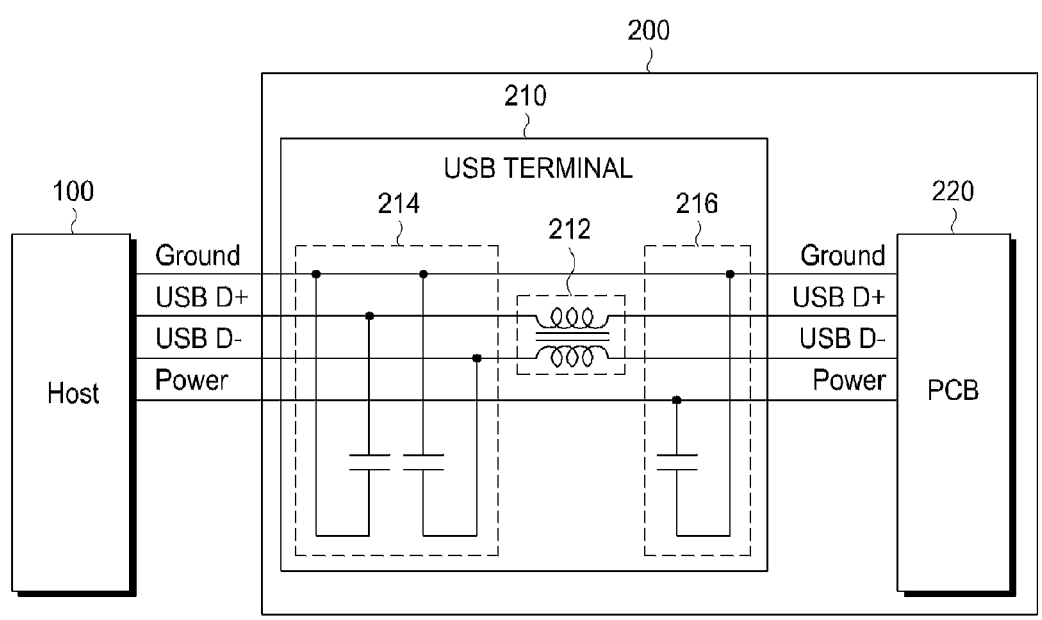
FIG. 2 illustrates a USB connector with a noise reduction circuit according to an exemplary embodiment of the present invention.

FIG. 2 illustrates a USB connector with a noise reduction circuit according to an exemplary embodiment of the present invention.

Referring to FIG. 2, a USB connector 200 is connected to a host 100 (e.g., a computer) and includes a noise reduction circuit 210 and a PCB 220.

The noise reduction circuit 210 includes a common-mode filter 212, bypass capacitors 214, and a decoupling capacitor 216.

The common-mode filter 212, mounted on USB D+/D− lines (or data lines), blocks harmonic frequency signals (or common-mode signals), which are generated between a USB D+ line and a USB D− line during USB data transmission, and transmits, without substantial loss, data signals which operate in a differential mode in which signals on the USB D+ line and the USB D− line are equal in magnitude, but opposite in phase. The common-mode filter 212 may block noise of 100 MHz or more. An impedance of the common-mode filter 212 used in this exemplary embodiment of the present invention may range from 70 to 120 ohms.

The bypass capacitors 214 are disposed between the ground line and their associated USB D+/D− lines, respectively. To reduce high-frequency noise, a high frequency resonates so as to bypass noise components of the frequency into the ground terminal, thereby removing the noise components. To minimize distortion of USB communication signals, the bypass capacitors 214 may have a capacitance of 10 pico Farad (pF) or below.

The decoupling capacitor 216 is connected between the power line and the ground line, to reduce the high-frequency noise, which is coupled to the power line and the ground line. The decoupling capacitor 216 has a capacitance of 10 to 300 pF according to the operating frequency of a wireless communication device, to which the USB connector 200 is connected.

As for a noise reduction circuit having this structure, its time constant may be optimized without a change in the circuit, making it possible to improve its performance in all wireless communication systems, such as USB 1.1, USB 2.0, and USB 3.0, regardless of USB transfer rate.

Figure 3A:
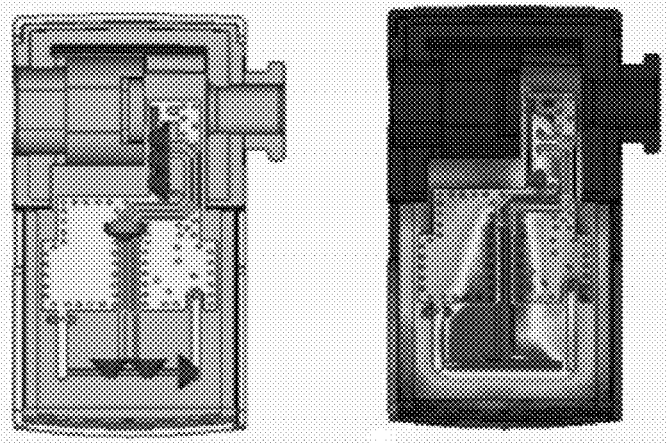
FIG. 3A illustrates a field distribution in a wireless communication device with a USB connector according to the related art.
Figure 3B:
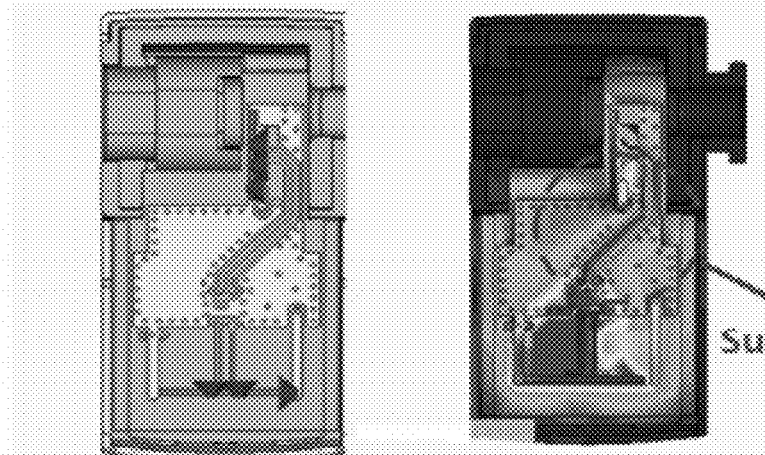
FIG. 3B illustrates a USB connector with a noise reduction circuit according to an exemplary embodiment of the present invention.
Figure 4:
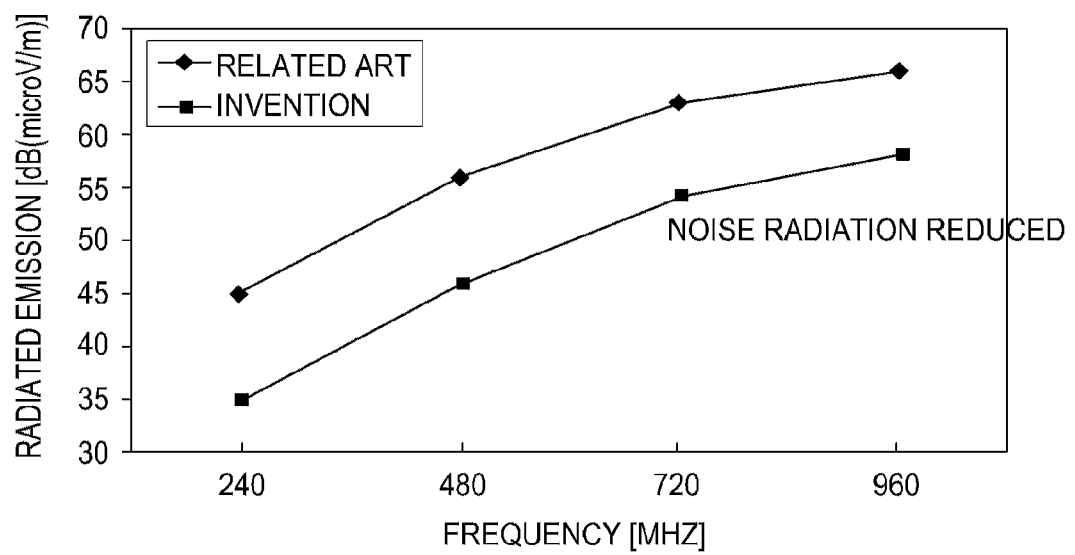
FIG. 4 illustrates comparative noise radiation in wireless communication devices with USB connectors according to an exemplary embodiment of the present invention.

FIG. 3A illustrates a field distribution in a wireless communication device with a USB connector according to the related art. FIG. 3B illustrates a USB connector with a noise reduction circuit according to an exemplary embodiment of the present invention. FIG. 4 illustrates comparative noise radiation in wireless communication devices with USB connectors according to an exemplary embodiment of the present invention.

Referring to FIGS. 3A and 3B, it can be understood that the USB connector of this exemplary embodiment of the present invention with a noise reduction circuit is lower than the USB connector of the related art in terms of a near-field level. Referring to FIG. 4, it can be noted that compared with the USB connector of the related art, the USB connector of this exemplary embodiment of the present invention may reduce noise by about 8 to 10 decibels (dB) in all frequency domains.

Figure 5A:
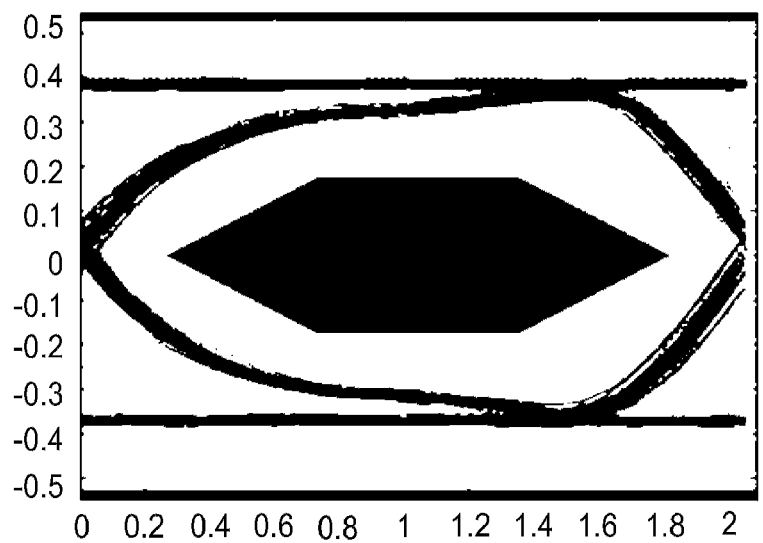
FIG. 5A illustrates a compliance test result on a wireless communication device with a USB connector according to the related art.
Figure 5B:
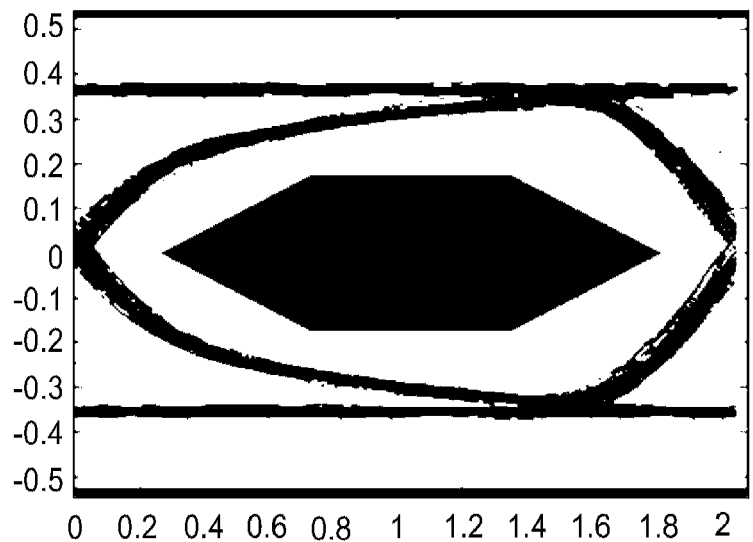
FIG. 5B illustrates a compliance test result on a wireless communication device with a USB connector according to an exemplary embodiment of the present invention.
Figure 6:
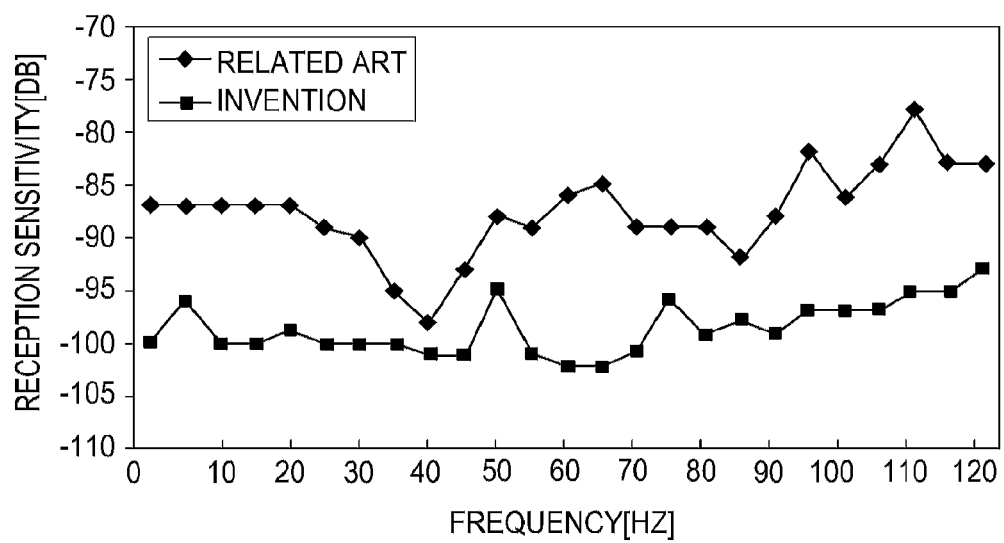
FIG. 6 illustrates comparative reception sensitivity in wireless communication devices with USB connectors according to an exemplary embodiment of the present invention.

FIG. 5A illustrates a compliance test result on a wireless communication device with a USB connector according to the related art. FIG. 5B illustrates a compliance test result on a wireless communication device with a USB connector according to an exemplary embodiment of the present invention. FIG. 6 illustrates comparative reception sensitivity in wireless communication devices with USB connectors according to an exemplary embodiment of the present invention.

Referring to FIGS. 5A and 5B, it can be noted that when data communication is performed using a wireless communication device with the USB connector of an exemplary embodiment of the present invention, USB data signals operate in a differential mode, preventing impact on the signal quality.

A wireless communication device with a USB connector according to an exemplary embodiment of the present invention may equally block noise no matter whether the USB connector is rotatable, or integrated into the communication device, making it possible to improve reception sensitivity. Referring to FIG. 6, reception sensitivity is measured after applying the proposed noise reduction circuit to a USB dongle employing Global System for Mobile (GSM) communication. Compared with the USB connector of the related art, the USB connector of an exemplary embodiment of the present invention may improve reception sensitivity by about 10 dB on average, and by a maximum of about 20 dB.

As is apparent from the foregoing description, by mounting a noise reduction circuit inside a USB connector, exemplary embodiments of the present invention may effectively reduce noise generated in USB communication.

By mounting a noise reduction circuit inside a USB connector, exemplary embodiments of the present invention may effectively reduce noise in a wireless communication device with a rotary-type USB connector.

By mounting a noise reduction circuit inside a USB connector, exemplary embodiments of the present invention may effectively reduce noise without mechanical shielding, contributing to cost reduction.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A Universal Serial Bus (USB) apparatus for USB communication, the USB apparatus comprising:
   a Printed Circuit Board (PCB) including a circuit configured to communicate a data signal to an external device according to a USB communication standard;
   a connector configured to connect to a USB terminal of the external device; and
   a noise reduction circuit connected between an output terminal of the PCB and the connector, the noise reduction circuit configured to reduce high-frequency noise of the data signal comprising a '+' data signal and a '−' data signal,
   wherein the noise reduction circuit includes:
      a common-mode filter configured to remove harmonic components generated between the '+' data signal and the '−' data signal and to pass the '+' data signal and the '−' data signal, which operate in a differential mode, and
      a first bypass capacitor connected between a ground line and a '+' data line for outputting the '+' data signal and a second bypass capacitor connected between the ground line and a '−' data line for outputting the '−' data signal, the first and second bypass capacitors respectively configured to block the high-frequency noise included in the '+' and '−' data signals, and
   wherein a rating of the first and second bypass capacitors is less than or equal to 10 pico Farad (pF).

2. The USB apparatus of claim 1, wherein an impedance of the common-mode filter ranges from 70 to 120 ohms.

3. The USB apparatus of claim 1, wherein the connector is rotatably connected to the noise reduction circuit.

4. The USB apparatus of claim 1, wherein the connector reduces the high-frequency noise by 8 to 10 decibels (dB) in all frequency domains.

5. A Universal Serial Bus (USB) apparatus for USB communication, the USB apparatus comprising:
   a Printed Circuit Board (PCB) including a circuit configured to communicate a data signal to an external device according to a USB communication standard;
   a connector configured to connect to a USB terminal of the external device; and
   a noise reduction circuit connected between an output terminal of the PCB and the connector, the noise reduction circuit configured to reduce high-frequency noise of the data signal comprising a '+' data signal and a '−' data signal,
   wherein the noise reduction circuit includes:
      a common-mode filter configured to remove harmonic components generated between the '+' data signal and the '−' data signal and to pass the '+' data signal and the '−' data signal, which operate in a differential mode; and
      a decoupling capacitor connected between a power line supplying power to the noise reduction circuit and a ground line, the decoupling capacitor configured to block the high-frequency noise, which is coupled to the power line and the ground line, and
   wherein a rating of the decoupling capacitor ranges from 10 to 300 pico Farad (pF).

* * * * *